United States Patent
Hong et al.

(12) 
(10) Patent No.: US 6,172,733 B1
(45) Date of Patent: Jan. 9, 2001

(54) LIQUID CRYSTAL DISPLAY INCLUDING CONDUCTIVE LAYER PASSING THROUGH MULTIPLE LAYERS AND METHOD OF MANUFACTURING SAME

(75) Inventors: Chan Hee Hong; Byoung Ho Lim; Jong Woo Kim; Hye Young Kim, all of Kumi (KR)

(73) Assignee: LG.Philips LCD Co., Ltd., Seoul (KR)

( * ) Notice: Under 35 U.S.C. 154(b), the term of this patent shall be extended for 0 days.

(21) Appl. No.: 09/145,448

(22) Filed: Sep. 2, 1998

(30) Foreign Application Priority Data

Feb. 20, 1998 (KR) .................................................. 98-5363

(51) Int. Cl.[7] .................................................. G02F 1/1345
(52) U.S. Cl. ............................................. 349/152; 349/149
(58) Field of Search .................................. 349/149, 152, 349/192

(56) References Cited

U.S. PATENT DOCUMENTS

| | | | |
|---|---|---|---|
| 5,162,933 | * 11/1992 | Kakuda et al. | 349/46 |
| 5,467,882 | 11/1995 | Ahn . | |
| 5,532,853 | * 7/1996 | Song et al. | 349/149 |
| 5,852,481 | * 12/1998 | Hwang | 349/43 |

FOREIGN PATENT DOCUMENTS

| | | |
|---|---|---|
| 0 834 920 A1 | 4/1998 | (EP) . |
| 2 307 597 | 5/1997 | (GB) . |
| 2 308 234 | 6/1997 | (GB) . |
| 2 322 968 | 9/1998 | (GB) . |
| 2 323 959 | 10/1998 | (GB) . |
| WO 92/06505 | 4/1992 | (WO) . |

* cited by examiner

Primary Examiner—Walter Malinowski

(57) ABSTRACT

An LCD is adapted to be manufactured using a significantly reduced number of masks and masking processes. In order to form a gate of the LCD, aluminum and one of molybdenum, tantalum, tungsten and antimony are sequentially deposited and patterned using a single mask. Cutting a shorting bar for preventing static electricity is performed while a passivation layer is patterned and rinsed. Accordingly, an LCD produced by this method includes a first metal layer, which includes a first contact hole and is disposed on a substrate, a second metal layer which covers the first metal layer and includes a second contact hole which is smaller than the first contact hole, an insulating layer, which covers the second metal layer and includes a third contact hole larger than the second contact hole, and a pad, which includes a conductive layer contacting the second metal layer through the third contact hole on the insulating layer.

13 Claims, 13 Drawing Sheets

LIQUID CRYSTAL DISPLAY INCLUDING CONDUCTIVE LAYER PASSING THROUGH MULTIPLE LAYERS AND METHOD OF MANUFACTURING SAME

BACKGROUND OF THE INVENTION

1. Field of the Invention

The present invention relates to a liquid crystal display (LCD) which includes thin film transistors (TFTs) and to a method of manufacturing the same and more specifically, to a method of manufacturing LCDs which has a reduced number of masking steps.

2. Description of the Related Art

Among display devices for showing visual images on a screen, thin film flat panel display devices are highly favored because of their light weight and easy adaptability. Recent research activities have focused on the development of liquid crystal display devices because of their high resolution and fast response time suitable for display of motion picture images.

A liquid crystal display device works by using polarization and optical anisotropy of a liquid crystal. By controlling the orientation of rod-shaped liquid crystal molecules via a polarization technique, transmission and interception of a light through the liquid crystal molecules are achieved due to the anisotropy of the liquid crystal. This principle is utilized in liquid crystal display devices. Active matrix liquid crystal displays (or AMLCDs) having TFTs arranged in a matrix pattern and pixel electrodes connected to the TFTs provide high quality images and are now widely used. An active panel of a conventional LCD will now be described with reference to FIG. 1.

The conventional LCD comprises two panels 3 and 5 on which a plurality of elements are placed, and liquid crystal (not shown) is located between the two panels 3, 5. One panel of the LCD includes elements reproducing colors, which panel is called a color filter panel 3. The color filter panel 3 has color filters 7 including red (R), green (G) and blue (B) filters, which are sequentially arranged on a first transparent substrate 81 and correspond to pixels formed in a matrix pattern. Among these color filters 7, black matrixes 9 are arranged in a lattice pattern so as to prevent mixture of colors at boundaries between the color filters. A common electrode 85 covers the color filters 7 and functions as one electrode for generating an electric field applied to the liquid crystal.

The other panel is an active panel 5 which includes switch elements and bus lines, which generate the electric field for driving the liquid crystal. The active panel 5 has a pixel electrode 41 which is disposed on a second transparent substrate 83. The pixel electrode 41 is located opposite to the common electrode 85 disposed on the color filter panel 3 and functions as the other electrode for generating the electric field applied to the liquid crystal. Signal bus lines 13 extend along the column direction of the array of the pixel electrodes 41 and data bus lines 23 extend along the row direction of the array of the pixel electrode 41. A TFT 89 which functions as a switch element for driving the pixel electrode 41 is formed on the substrate 83. A gate electrode 11 of the TFT 89 is connected with the signal bus line 13 ("gate bus line"), a source electrode 21 is connected with the data bus line 23 ("source bus line"). A drain electrode 31 of the TFT 89 is connected with the pixel electrode 41.

Between the source electrode 21 and the drain electrode 31, a semiconductor layer 33 is formed as seen in FIG. 2. The source electrode 21 and the drain electrode 31 are in ohmic contact with the semiconductor layer 33. A gate pad 15 and a source pad 25, which function as terminals receiving external signals, are disposed at the end portions of the gate bus line 13 and the source bus line 23, respectively. A gate pad terminal 57 and a source pad terminal 67 are formed on the gate pad 15 and the source pad 25, respectively.

When an external electric signal, which is applied to the gate pad 15, is sent to the gate electrode 11 through the gate bus line 13, electrical picture data, which is applied to the source pad 25, is sent to the source electrode 21 through the source bus line 23 and to the drain electrode 31. If the electric signal is not applied to the gate bus line 13, the drain electrode 31 is electrically isolated from the source electrode 21. Accordingly, whether the data signal is applied to the drain electrode 31 is determined by controlling the signal to the gate electrode 11. Therefore, application of the data signal to the pixel electrode 41, which is connected with the drain electrode 31, is artificially controlled. In other words, the TFT 89 functions as a switch for selectively driving the pixel electrode. A gate insulating layer 17 is formed between the gate bus line 13 and the source bus line 23 in order to electrically isolate the gate bus line 13 and the source bus line 23 and a passivation layer 37 covers the source bus line 23 in order to protect the elements as shown in FIGS. 3a–3f described below.

These two panels, i.e. the color filter panel 3 and the active panel 5, are arranged to face each other with a certain distance or "cell gap" disposed therebetween. In between the spaced panels 3, 5 in the cell gap, liquid crystal is injected. In order to keep the cell gap between the two panels 3 and 5 constant and to prevent the liquid crystal from leaking outside, the edges of the joined panels are sealed with epoxy or similar material. The liquid crystal panel is now completed as described above.

Many complicated processes for manufacturing the liquid crystal panel are required, especially, many masking processes for manufacturing the active panel including TFTs. Because the active panel includes the elements which mainly affect the performance of the LCD, it is important for manufacturing high quality LCD products to simplify the processes for manufacturing the active panel. In general, the manufacturing processes are determined by the types of materials used to form each element, the structure thereof and methods for solving the problems such as static electricity which occur during the forming processes.

Although a resistance of a material used to form gate bus lines rarely affects the picture quality when manufacturing the conventional miniature liquid crystal display device, the resistance affects the picture quality when manufacturing a large area liquid crystal display, i.e. computer monitor of 12 inches or more. In other words, a metal which has a good surface-stability when the metal is formed into a thin film, such as tantalum, tungsten and molybdenum, is used for forming gate elements (gate bus lines, gate electrodes and gate pads) of the conventional miniature LCD. For forming the gate elements of the large area LCD, a metal which has a low resistance, such as aluminum, is preferably used.

However, there are many problems with forming the gate elements of aluminum or aluminum alloy. Hillocks, which are formed on the surface of the aluminum, are the most serious problem. After depositing aluminum, minute particles of the aluminum exist on the aluminum film. During the manufacturing process, the particles are growing so much that they break an insulating layer because of a high temperature condition, resulting in the deterioration of the LCD. Furthermore, if the gate elements are formed of aluminum, the contact-resistance between the gate elements and ITO increases. In other words, $Al_2O_3$ film is unintentionally formed between the aluminum and the ITO when the ITO is deposited on the aluminum, and consequently, the contact-resistance increases. As a result, transmission of the electric signal to the gate is significantly delayed.

In order to enhance the surface-stability of the aluminum film, the conventional art includes a step of anodizing the surface of the aluminum. When anodizing the aluminum, a portion of the aluminum, which should be electrically connected with an external element such as the gate pad, is not anodized. Instead, an interim electrode is formed with a metal such as chromium in order to maintain the contact-resistance in a normal state. This conventional method requires 8 masking steps or processes. The conventional art, which anodizes the aluminum film, will he described below with reference to FIG. 2 and FIGS. 3a–3h.

Aluminum is deposited on a transparent glass substrate 1. A gate bus line 13, a gate pad 15, a gate electrode 11, a short line 19 and a source short connector 27 are formed using a first mask. The short line 19 extends along the edge of the substrate 1 and is connected to each of the gate pads 15. Accordingly, gate elements (the gate electrode, the gate pad, the gate bus line, the short line and the source short connector) have the same electric potential, so that disconnection due to the static electricity, which occurs during the manufacturing process and insulating destruction are prevented. The source short connector 27 will be connected with a source pad in a later step. The source short connector 27 keeps source bus lines at the same electric potential through the short line 19 when the source bus lines are formed (FIGS. 2 and 3a).

The surface of the gate elements is anodized in order to prevent formation of hillocks on the surface thereof. A portion of the gate elements which should be electrically connected with another conductive layer is not anodized by selectively performing the anodization using a photo-resist. The photo-resist is patterned to expose another portion of the gate elements which should be anodized by using a second mask and the anodization step is performed. The patterned photo-resist covers a portion of the gate pad 15 and a portion of the short line 27, both of which will be connected to a source pad and then the anodization process is performed. As a result, an anodized layer 91 is formed on a portion of the aluminum layer as shown in FIG. 3b.

A gate insulating layer 17 is then formed by depositing an insulating material such as $SiN_x$ or $SiO_x$ on the substrate. An intrinsic semiconductor, i.e. amorphous silicon and an impurity doped semiconductor, i.e. doped amorphous silicon, are sequentially deposited. A semiconductor layer 33 and a doped semiconductor layer 35 are formed by patterning the intrinsic semiconductor and impurity doped semiconductor using a third mask (FIGS. 2 and 3c).

A portion of the gate insulating layer 17, which covers the gate pad 15 and the source short connector 27, is removed by using a fourth mask. Then, the gate pad 15 and the source short connector 27 are exposed (FIG. 3d).

Chromium or chromium alloy are deposited on the substrate including the gate insulating layer 17, and patterned to form a source bus line 23, a source electrode 21, a source pad 25, a drain electrode 31 and a gate pad interim electrode 53 by using a fifth mask. The source pad 25 is connected with the source short connector 27 which is exposed through the gate insulating layer 17. Accordingly, all source bus lines 23 are connected with the short line 19, so as to have the same electric potential. The gate pad interim electrode 53 is connected with the gate pad 15 which is exposed through the gate insulating layer 17 (FIGS. 2 and 3e).

A passivation layer 37 is formed by depositing an insulating material, i.e. $SiO_x$ or $SiN_x$, on the source elements (the source electrode, the drain electrode, the source bus line, the source pad and the gate pad interim electrode). The gate pad interim electrode 53, the source pad 25 and the drain electrode 31 are exposed by patterning the passivation layer 37 using a sixth mask (FIG. 3f).

All of the gate pads 15 and all of the source pads 25 are connected to the short line 19. Therefore, the source pads 25 and the gate pads 15 have the same electric potential during the manufacturing process, so that disconnection of lines due to static electricity and the insulating destruction can be prevented. In the completed LCD product, the lines should not be connected. Instead, the lines should be separated individually. In order to achieve separation of the lines, a portion of the glass substrate 1 on which the short line 19 is located is removed by cutting. Before this cutting step, the signal lines should be tested to determine whether the adjacent lines are shorted and whether each line is disconnected. Generally, this testing step is performed by dividing the lines into an odd-numbered line group and an even-numbered line group, and by applying a voltage to the odd-numbered line group and then to the even-numbered line group, or vice versa. In order to test the lines by using this method, portions of the short line 19, which are squared in FIG. 2, should be removed. In other words, four corners of the short line 19 are cut so that short line 19 is divided into upper, lower, right and left segments. Connecting portions of the even-numbered gate bus lines, which are connected with the left segment of the short line 19, are cut, and connecting portions of the odd-numbered gate bus lines, which are connected with the right segment of the short line 19, are cut. As a result, the gate bus lines 13 are divided into a odd-numbered line group and an even-numbered line group. The source bus lines 23 are also divided into odd-numbered ones and even-numbered ones by using the same method. At this cutting step, connecting portions of the lines which should be cut, depicted by the reference number 93, are etched using a seventh mask (FIGS. 2 and 3g).

Finally, transparent conductive material, i.e. ITO (Indium Tin Oxide), is deposited on the passivation layer 37. A gate pad terminal 57, which is connected with the gate pad interim electrode 53, a source pad terminal 67, which is connected with the source pad 25, and a pixel electrode 41, which is connected with the drain electrode 31, are formed by patterning the ITO using an eighth mask (FIGS. 2 and 3h).

As described above, the gate elements are formed with aluminum, and the formation of hillocks on the surface of the aluminum film is prevented. The problems which result from the aluminum directly contacting the ITO are solved by depositing chromium between the gate pad and the ITO. However, this solution requires additional steps for anodizing the aluminum and cutting the connecting portions of the lines. In addition, this process requires at least eight (8) masking steps or processes. Each masking process, which is used for manufacturing the active panel of the LCD, comprises the steps of rinsing, depositing, baking and etching. Thus, each additional masking step that is required in this process causes the manufacturing time, difficulty and cost to be remarkably increased.

SUMMARY OF THE INVENTION

To overcome the problems described above, the preferred embodiments of the present invention provide a method of manufacturing LCDs in which gate elements are formed with a metal having a low resistance such as aluminum while reducing the number of masking steps required. In addition, the preferred embodiments of the present invention provide a method of preventing formation of hillocks on a surface of gate elements which are formed with aluminum in an LCD apparatus while allowing for fewer masking steps to be used as compared with prior art methods.

In the preferred embodiments of the present invention, the gate elements are formed by sequentially depositing aluminum, which has a low resistance, and a metal, which has a high melting point and is free from hillocks, such as molybdenum, tantalum, tungsten and antimony, and by patterning the deposited metals using a single mask. Therefore, the formation of hillocks on the surface of the aluminum is prevented, and the number of masking processes is reduced. A process for sequential deposition of aluminum and a hillock-free metal having a high melting point and a simultaneous etching of the metals has been developed by the applicant of this patent application and described in a patent application filed in the Korean Industrial Property Office (the Korean Patent Application No. 97-07010) as Korean Patent Application No. 97-07010. In the method described in this Korean Patent Application No. 97-07010, a first metal layer and a second metal layer are sequentially deposited, and the first and second metal layers are simultaneously wet-etched by using a single mask. As a result thereof, the width of the second metal layer is smaller than the width of the first metal layer. The width of the first metal layer is preferably larger than that of the second metal layer by about 1 μm to 4 μm in order to reliably prevent formation of hillocks.

The preferred embodiments of the present invention provide a method of manufacturing TFTs, which include gate elements formed of the above metals, by using only five (5) masking processes or steps, and provides a novel structure of TFTs manufactured by this inventive method.

Other features and advantages of the present invention will become apparent from the following description of preferred embodiments of the invention which refers to the accompanying drawings, wherein like reference numerals indicate like elements to avoid duplicative description.

DETAILED DESCRIPTION OF PREFERRED EMBODIMENTS

In order to overcome the problems with the prior art described above and provide the novel methods and structure described above, preferred embodiments of the present invention provide a method which includes the steps of depositing a first metal and a second metal on a substrate; forming a gate bus line, a gate electrode, a gate pad and a short line by patterning the first and second metals using a single mask; sequentially depositing a first insulating material, an intrinsic semiconductor material and an impurity doped semiconductor material; forming a semiconductor layer and a doped semiconductor layer by patterning the intrinsic semiconductor and the impurity doped semiconductor material; depositing a third metal on the substrate to form a source bus line, a source electrode, a drain electrode and a source pad; depositing an insulating material on the source elements and patterning the insulating layer to expose the gate pad, the source pad and the drain electrode while simultaneously cutting connecting portions of the gate bus lines and source bus lines which are connected with the short line; and forming a pixel electrode, a gate pad terminal and a source pad terminal with a transparent conductive material on the insulating layer. For a better understanding of the present invention, the preferred embodiments will now be described in detail.

Figure 1:
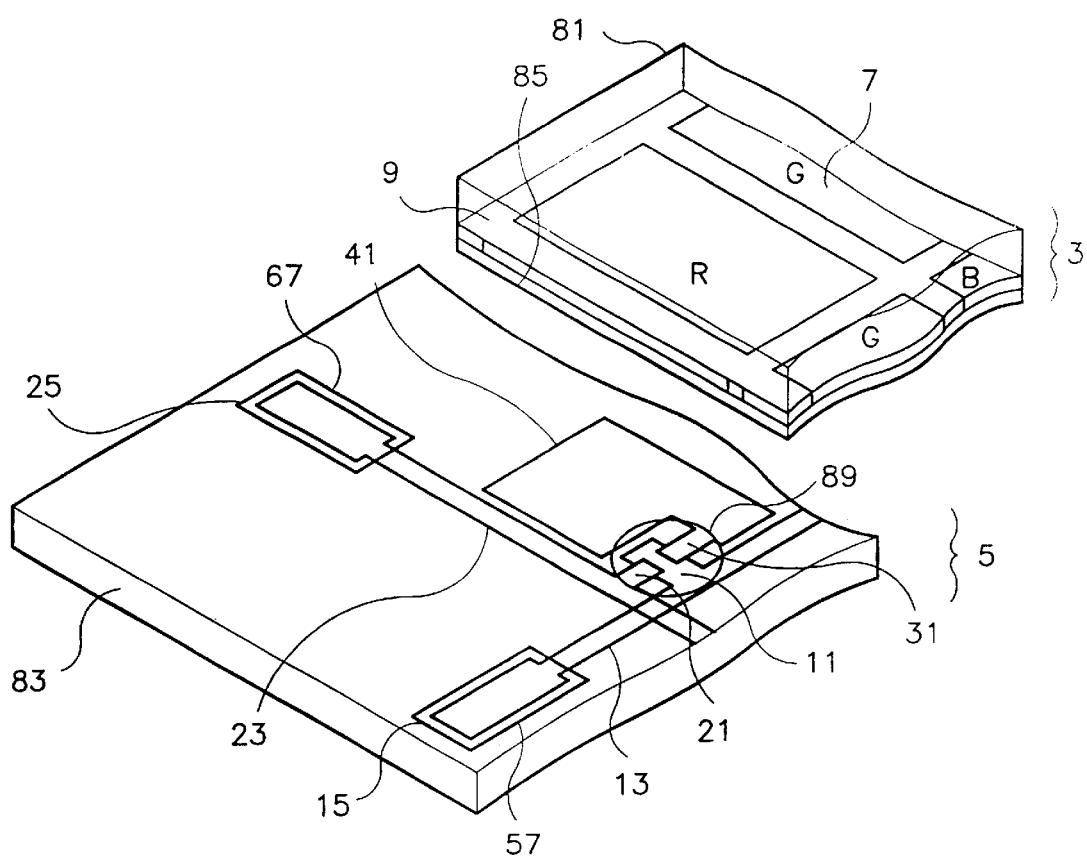
FIG. 1 is a three-dimensional view showing a conventional LCD.
Figure 2:
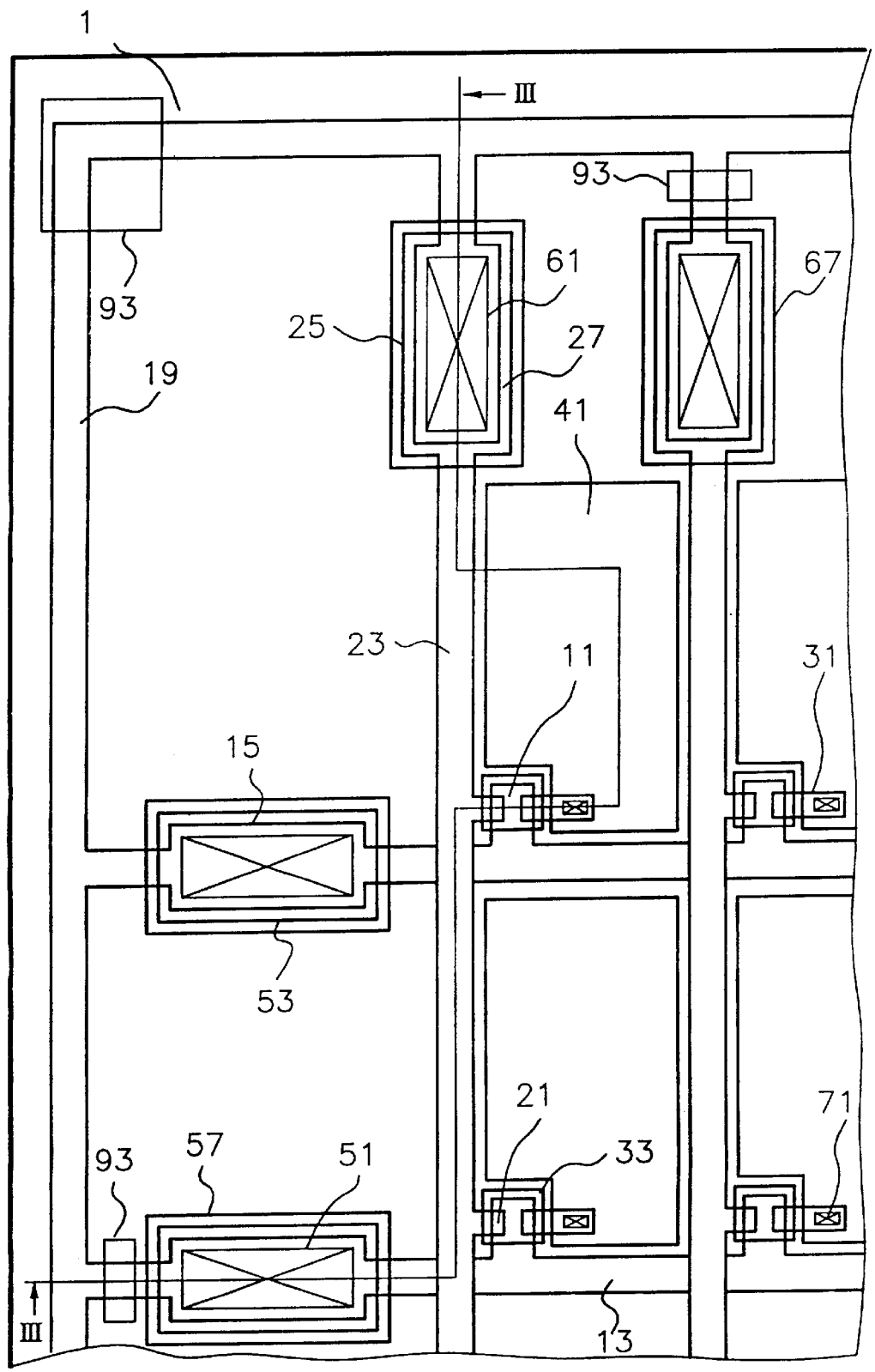
FIG. 2 is a plan view showing an active panel of the conventional LDC.
Figure 3A:
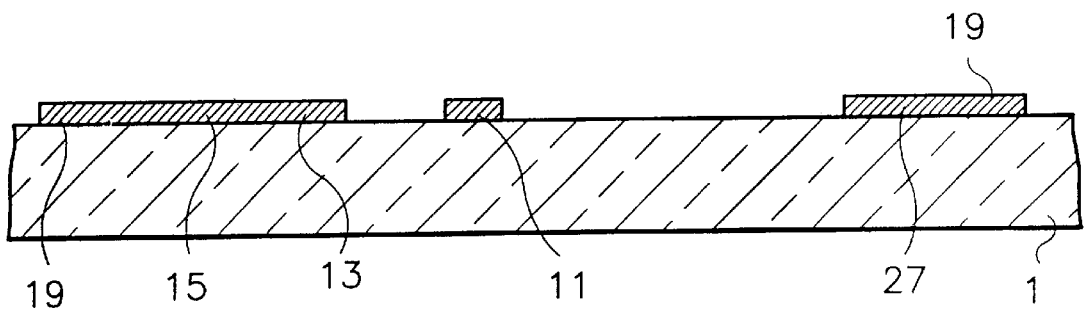
FIGS. 3a–3h are cross-sectional views showing the processes for manufacturing the active panel of the conventional LCD.
Figure 3B:
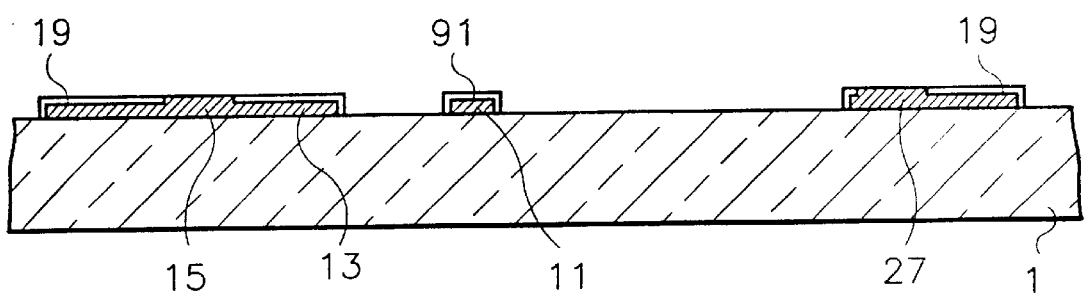
Figure 3C:
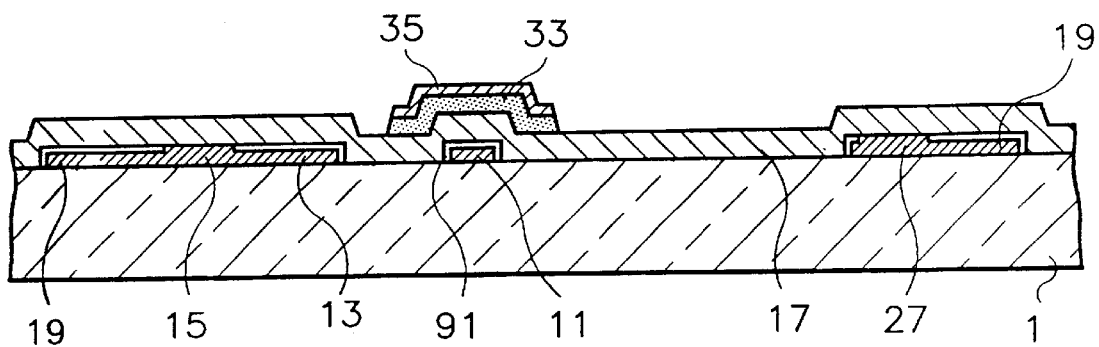
Figure 3D:
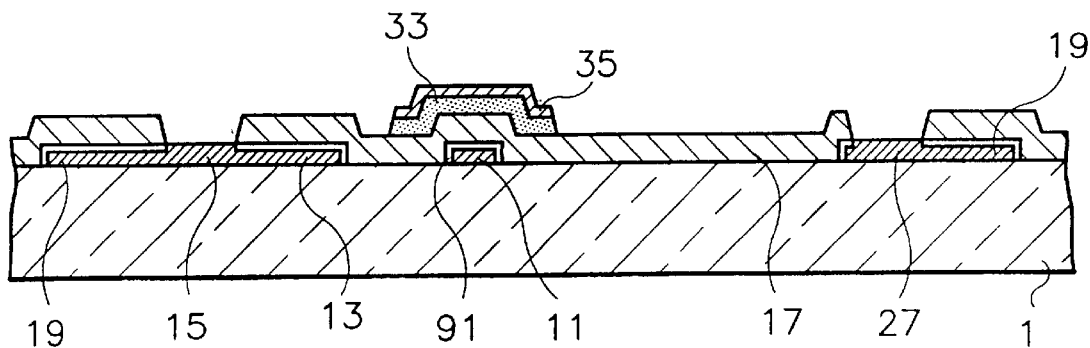
Figure 3E:
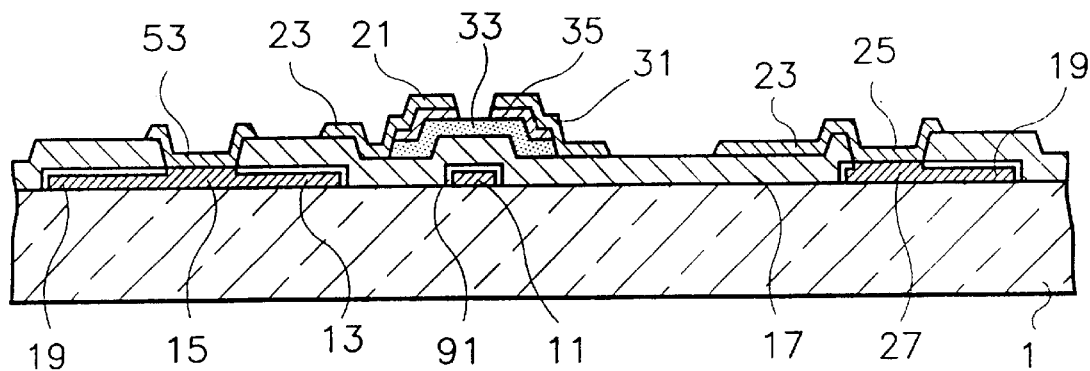
Figure 3F:
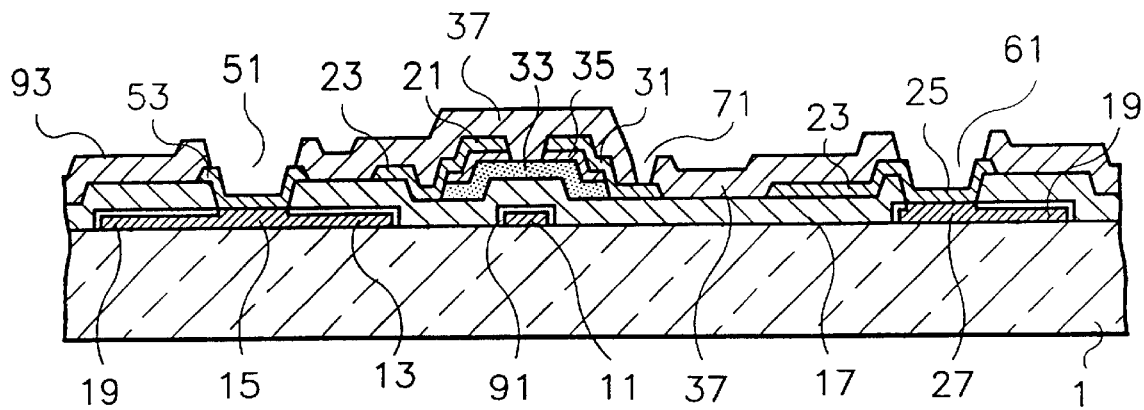
Figure 3G:
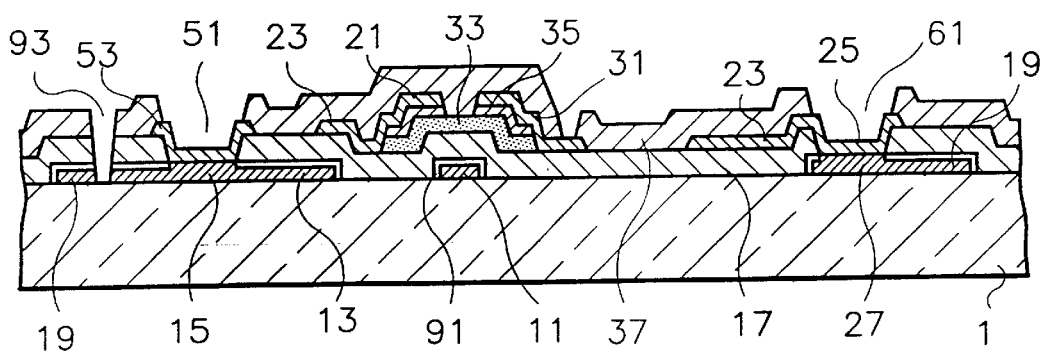
Figure 3H:
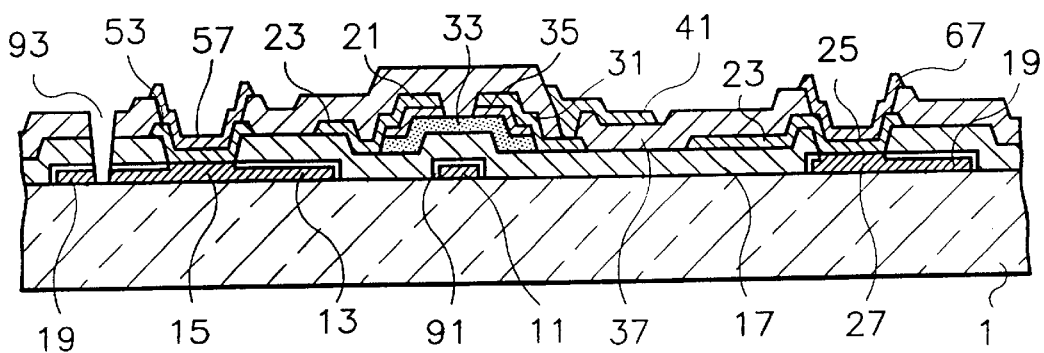
Figure 4:
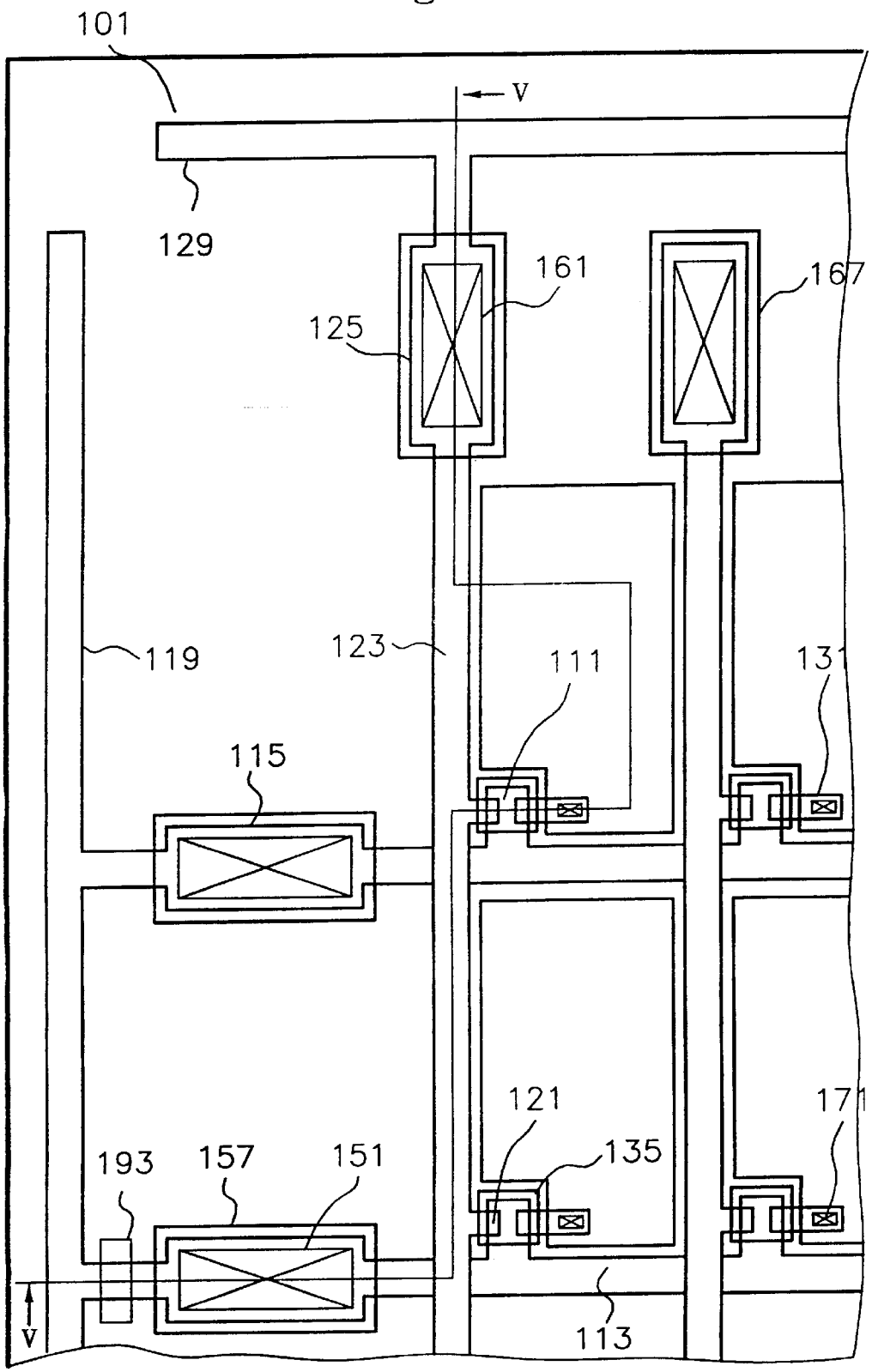
FIG. 4 a plan view showing an active panel of an LCD according a first preferred embodiment of the present invention.

The first preferred embodiment is described with reference to FIG. 4 and FIGS. 5a–5e, which are cross-sectional views taken along line V—V of FIG. 4.

Figure 5A:
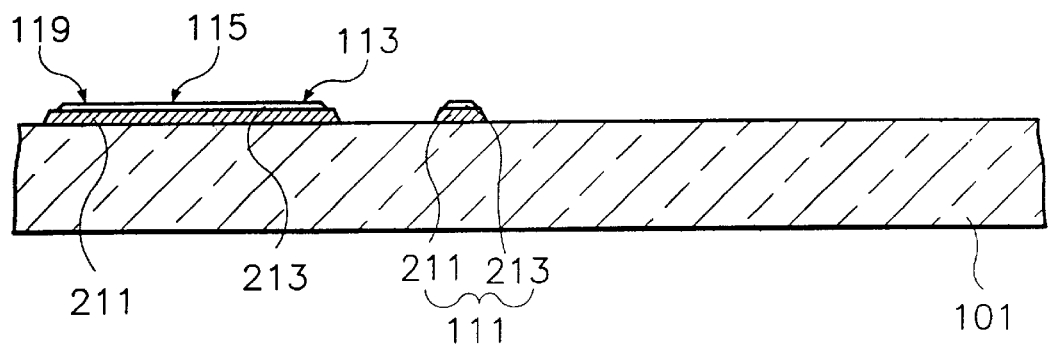
FIGS. 5a–5e are cross-sectional views showing the processes for manufacturing the active panel of the first preferred embodiment.

A first metal layer 211 is formed by depositing aluminum (Al) or aluminum alloy on a transparent glass substrate 101. A second metal layer 213 is formed by depositing on the substrate 101 a metal, which has a high melting point and is free from hillocks, such as molybdenum (Mo), tantalum (Ta), Tungsten (W) and antimony (Sb). A gate bus line 113, a gate electrode 111, a gate pad 115 and a gate short line 119 are formed by etching the two metal layers 211 and 213 using a first mask. At this step, the second metal layer 213 and the first metal layer 211 are wet-etched to form the gate elements (the gate bus line 113, the gate electrode 111, the gate pad 115 and the gate short line 119), so that the width of the second metal layer 213 is smaller than the width of the first metal layer 211. A plurality of the gate bus lines 113 are disposed to extend horizontally on the substrate 101. The gate electrode 111, which extends from the gate bus line 113, is located at a corner of a pixel. The gate pad 115 is located at the end portion of the gate bus line 113. A plurality of the gate pads 115 are connected with the gate short line 119 so that each gate pad 115 has the same electric potential. As a result, disconnection of the lines and the insulating destruction due to the static electricity is reliably prevented (FIGS. 4 and 5a).

Figure 5B:
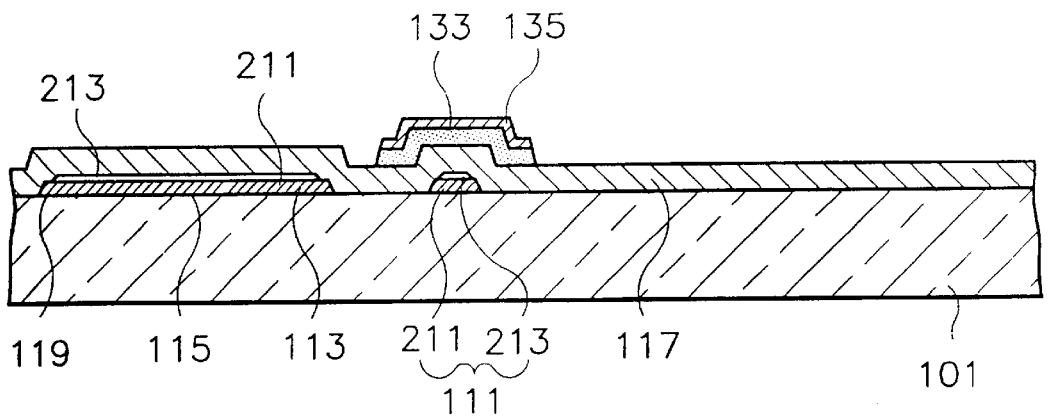

A gate insulating layer 117 is formed by depositing an insulating material, i.e. SiN$_x$ and SiO$_x$, or by coating an organic insulating material, such as BCB (BenzoCycloButene) and acrylic resin, on the substrate 101 which includes the first and second metal layers 211 and 213. An intrinsic semiconductor, such as an amorphous silicon, and an impurity doped semiconductor, such as an impurity doped amorphous silicon, are sequentially deposited. A semiconductor layer 133 and a doped semiconductor layer 135 are formed by patterning the deposited intrinsic semiconductor and the impurity doped semiconductor by using a second mask. The semiconductor layer 133 is placed over the gate electrode 111 (FIGS. 4 and 5b).

Figure 5C:
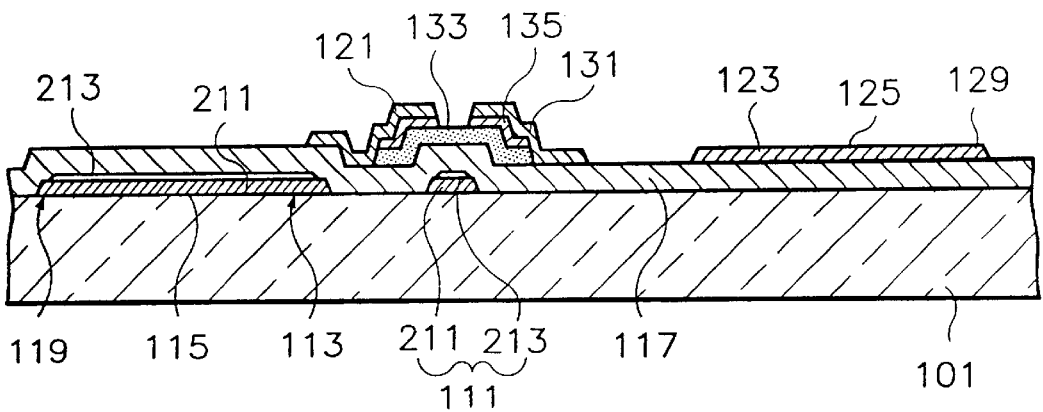

Chromium (Cr) or chromium alloy is deposited on the substrate 101 including the doped semiconductor layer 135. A source bus line 123, a source electrode 121, a drain electrode 131, a source pad 125 and a source short line 129 are formed by patterning the deposited chromium or chromium alloy using a third mask. A plurality of source bus lines 123, which are disposed on the gate insulating layer 117, extend vertically to the gate bus lines 113. The source electrode 121, which extends from the source bus line 123, is connected with one side of the doped semiconductor layer 135. The drain electrode 131, which is opposite to the source electrode 121, is connected with another side of the doped semiconductor layer 135. The source pad 125 is placed at the end portion of the source bus line 123. All of the source pads 125 are connected with the source short line 129. In some cases, a source short line 129, which is connected to the odd source pads 125, is placed on the upper side of the substrate 101 and an additional source short line (not shown), which is connected to the even-numbered source pads 125, is formed on the lower side of the substrate 101. Because FIG. 4 shows one corner of the substrate, the odd-numbered source pads 125 are connected with the source short line 129, and the even-numbered source pads 125 are not connected with the source short line 129. Accordingly, all of the source bus lines 123 are connected with one another, so that line disconnection due to the static electricity is prevented from occurring (FIGS. 4 and 5c).

A passivation layer 137 is formed by depositing an inorganic insulating material, such as $SiN_x$ and $SiO_x$, or by coating an organic insulating material, such as BCB and acrylic resin, on the substrate including the source elements (the source bus line 123, the source electrode 121, the drain electrode 131, the source pad 125 and the source short line 129). A source contact hole 161 and a drain contact hole 171 are formed by removing a portion of the passivation layer 137, which covers the source pad 125 and the drain electrode 131, using a fourth mask. A gate contact hole 151 and a short line cutting hole 193 are formed by removing the passivation layer 137 and the gate insulating layer 117, which cover the gate pad 115 and the gate short line 119 connected with the odd-numbered the gate lines, respectively. A portion of the gate elements, which portion is exposed through the short line cutting hole 193, should preferably be removed. In other words, the gate bus lines are divided into an odd-numbered line group and an even-numbered line group by cutting the connecting portions of the odd-numbered gate pads or by cutting the connecting portions of the even-numbered gate pads, both of which are connected with the gate short line at the left side of the substrate, the odd gate pads are connected with the gate short line 119, and the even-numbered gate pads are not connected with the gate short line 119. Although the right side of the substrate is not shown in the drawings, the even-numbered gate pads are connected with the gate short line 119 and the odd-numbered gate pads are not connected with the gate short line 119.

Contrary to the conventional method, the preferred embodiments of the present invention do not need any additional cutting steps and provides the following method. The gate elements are made of the first metal layer 211, which is comprised of aluminum, and the second metal layer 213, which is comprised of a metal having a high melting point such as molybdenum, tungsten, tantalum and antimony. The second metal layer 213 is removed at the time of dry-etching the passivation layer 137 and the gate insulating layer 117 because the etch rate of the second metal layer 213, which is composed of molybdenum, tungsten, tantalum or antimony, is very similar to that of the passivation layer 137 and the gate insulating layer 117. In other words, in order to cut the short line with ease at the time of etching the passivation layer 137 and the gate insulating layer 117, a metal, which has a high melting point and a similar etch rate to the passivation layer 137 and the gate insulating layer 117, is used for preventing the formation of hillocks on the aluminum.

Figure 5D:
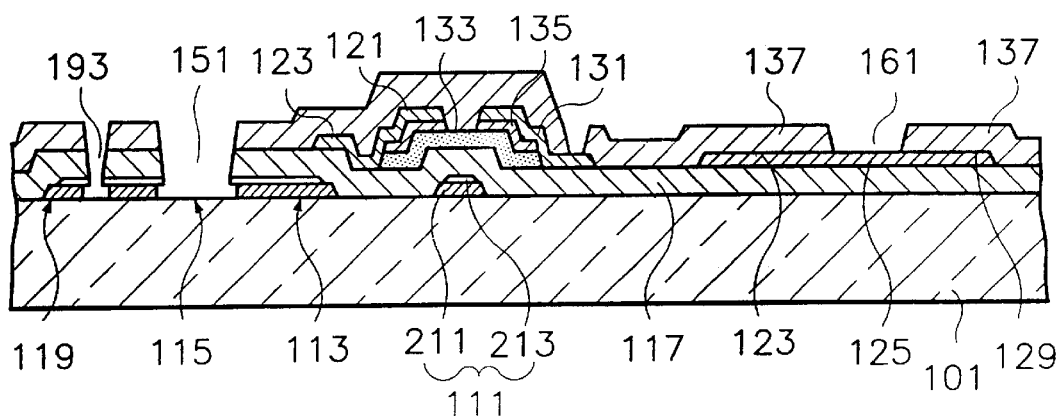

The aluminum, which still remains, is removed by using the following method. Generally, the etching process comprises the steps of depositing, coating a photo-resist, exposing, developing, etching and removing the photo-resist. The passivation layer 137 and the gate insulating layer 117 are also etched through these etching process steps. After removing the photo-resist, the remover, which is used for removing the photo-resist, is eliminated by applying a strong air stream and the resultant surface is rinsed. It takes a little time to move the substrate to a rinsing room after eliminating the remover. During this time, a little amount of the photo-resist remover, which still remains, contaminates the surface of the passivation layer 137. For preventing such contamination, the substrate is firstly wetted with a chemical agent, which rarely reacts with the passivation layer, and then moved to the rinsing room. At this step, a weak alkali, which reacts well with the first metal layer 211 but rarely reacts with the passivation layer 137, is used as the chemical agent. As a result, the exposed first metal layer 211 is removed (FIG. 5d).

Figure 5E:
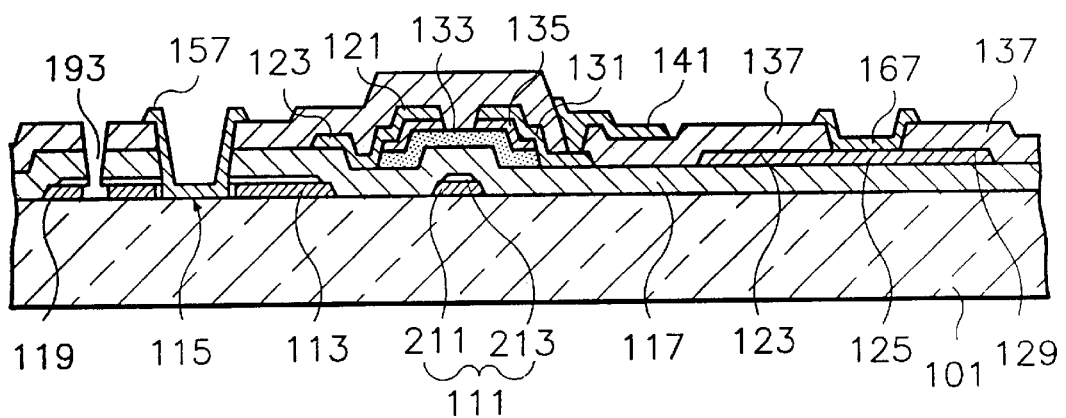

A transparent conductive material such as ITO (Indium-Tin-Oxide) is deposited on the passivation layer 137. A pixel electrode 141, a gate pad terminal 157 and a source pad terminal 167 are formed by patterning the ITO using a fifth mask. The pixel electrode 141 is connected with the drain electrode 131 which is exposed through the drain contact hole 171. The gate pad terminal 157 is connected with the etched side of the gate pad 115 which is etched along the contour of the gate contact hole 151. The gate pad terminal 157 is connected with the etched side of the second metal layer 213 and with the etched side of the first metal layer 211. The source pad terminal 167 is connected with the source pad 125 which is exposed through the source contact hole 161 (FIGS. 4 and 5e).

The second preferred embodiment presents another method of forming the gate short line and the source short line. For a better understanding, the preferred embodiment will now be described with reference to FIG. 6 and FIGS. 7a–7e which are cross-sectional views taken along line VII—VII of FIG. 6. The processes for manufacturing TFTs are described without reference to the cross-sectional views hereunder because they are preferably the same as the processes described in the first preferred embodiment.

Figure 6:
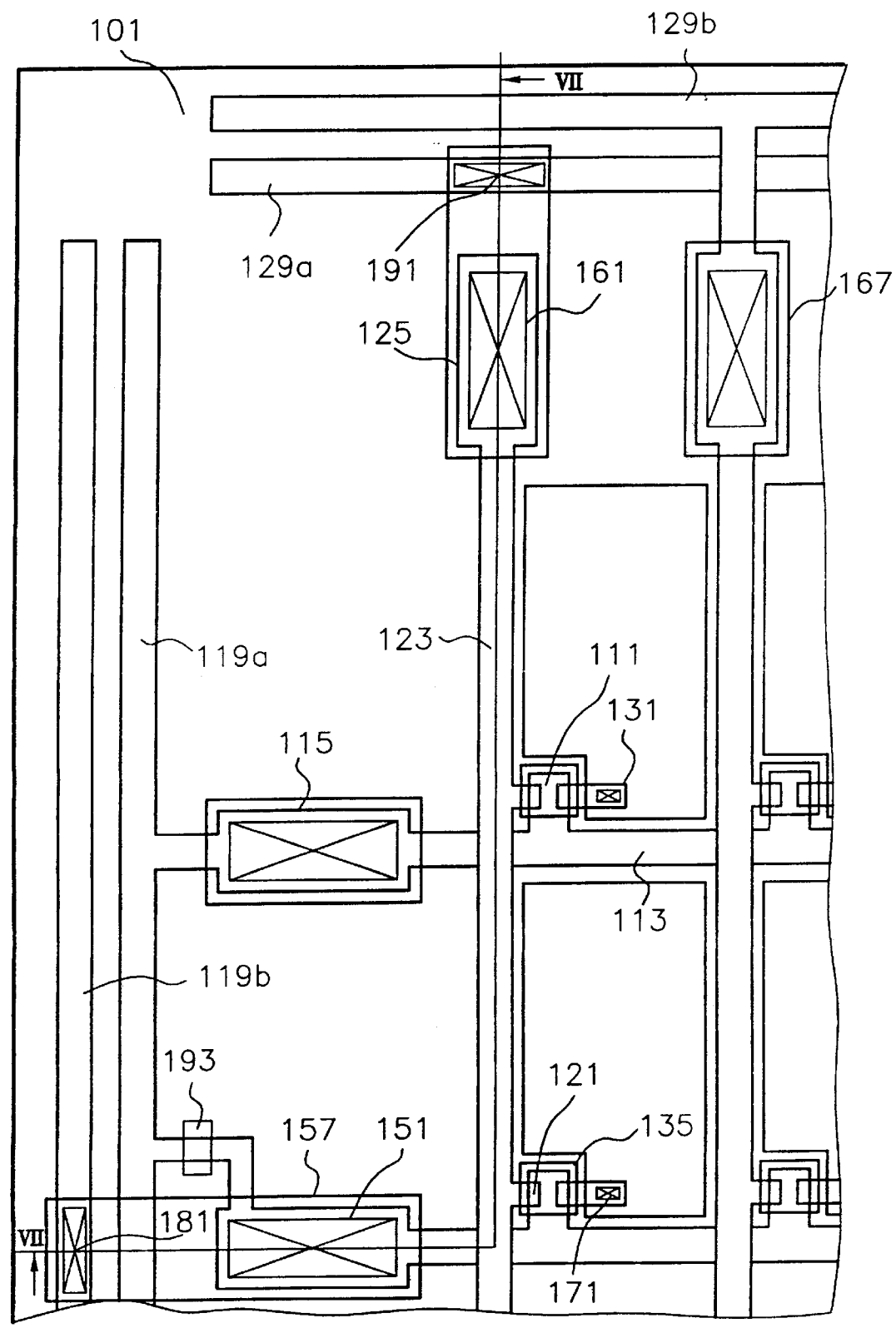
FIG. 6 is a plan view showing an active panel of an LCD according to a second preferred embodiment of the present invention.
Figure 7A:
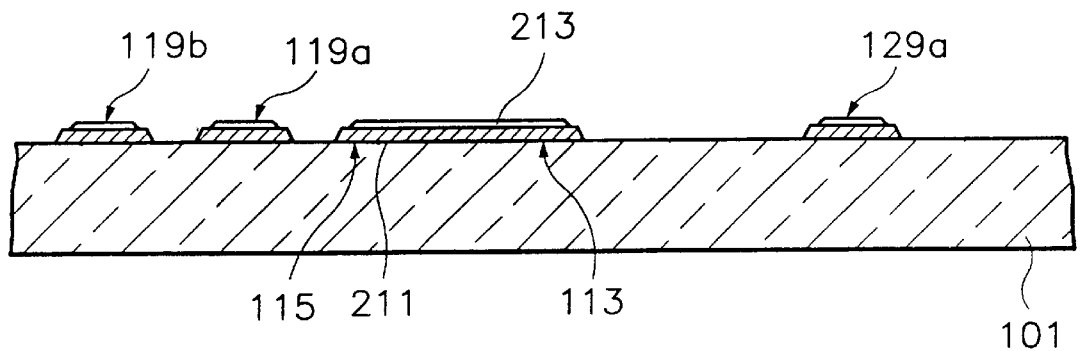
FIGS. 7a–7e are cross-sectional views showing the processes for manufacturing the active panel of the second preferred embodiment.

A first metal layer 211 is formed by depositing aluminum or aluminum alloy on a transparent glass substrate 101. A second metal layer 213 is formed by depositing on the substrate 101 a metal, which has a high melting point and is free from hillocks, such as molybdenum (Mo), tantalum (Ta), tungsten (W), or antimony (Sb). A gate bus line 113, a gate electrode 111, a gate pad 115, a first gate short line 119a and a first source short line 129a are formed by etching the two metal layers 211 and 213 using a first mask. At this step, the second metal layer 213 and the first metal layer 211 are wet-etched, so that the width of the second metal layer 213 is smaller than that of the first metal layer 211. A plurality of the gate bus lines 113 are arranged to extend horizontally on the substrate 101. The gate electrode 111, which extends from the gate bus line 113, is disposed at one corner of a pixel. The gate pad 115 is disposed at the end portion of the gate bus line 113. All of the gate pads 115 are connected to the first gate short line 119a, and therefore, all of the gate pads 115 have the same electric potential. As a result, line disconnection and insulating destruction due to the static electricity is reliably prevented. Even-numbered gate bus lines are connected with the first gate short line 119a via a detoured line in order to easily divide the gate bus lines into an odd-numbered line group and an even-numbered line group. The first source short line 129a will be connected with odd source bus lines which will be formed at a later step (FIGS. 6 and 7a).

Figure 7B:
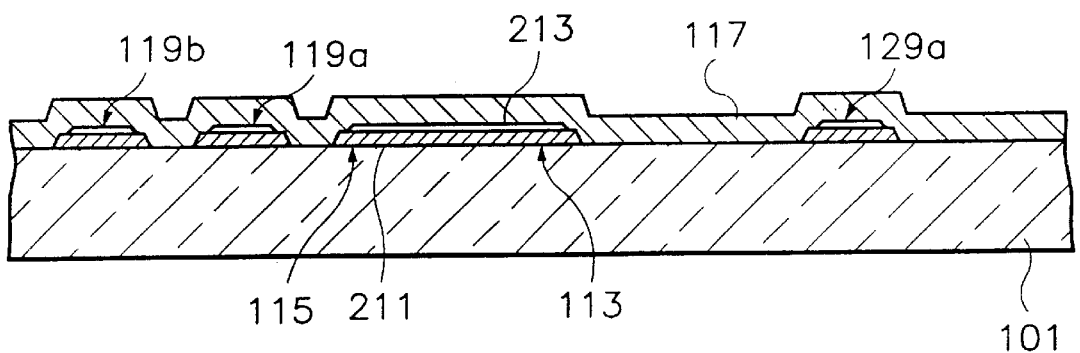

A gate insulating layer 117 is formed by depositing an inorganic insulating material, such as $SiN_x$ and $SiO_x$, or by coating an organic insulating material, such as BCB and acrylic resin, on the substrate 101 including the gate elements which include the first metal layer 211 and the second metal layer 213. An intrinsic semiconductor, such as intrinsic amorphous silicon, and an impurity doped semiconductor, such as impurity doped amorphous silicon, are sequentially deposited. A semiconductor layer 133 and a doped semiconductor layer 135 are formed by patterning the two semiconductor layers using a second mask. The semiconductor layer 133 is placed over the gate electrode 111 (FIGS. 6 and 7b).

Figure 7C:
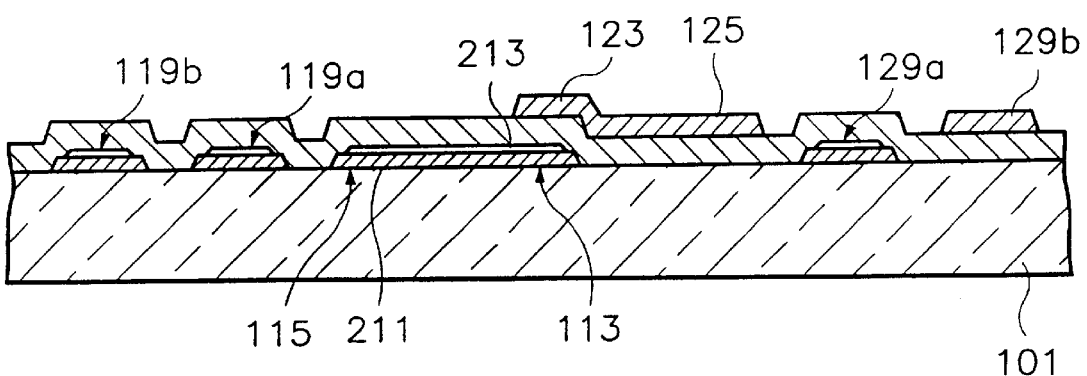

Chromium or chromium alloy is deposited on the substrate 101 including the semiconductor layer 133. A source bus line 123, a source electrode 121, a drain electrode 131, a source pad 125 a second gate short line 119b and a second source short line 129b are formed by patterning the chromium using a third mask. A plurality of source bus lines 123, which are placed on the gate insulating layer 117, extend vertically to the gate bus lines 113. The source electrode 121, which extends from the source bus line 123, is connected with one side of the doped semiconductor layer (not shown). The drain electrode 131, which is opposite to the source electrode 121, is connected with another side of the doped semiconductor layer (not shown). The source pad 125 is located at the end portion of the source bus line 123. The even-numbered source pads 125 are connected the second source short line 129b. Accordingly, the even-numbered source bus lines 123 are connected with one another, so that line disconnection due to the static electricity is prevented from occurring. Although the odd-numbered source pads 125 are not connected with any short line, the possibility of static electricity occurring is not considerable, and the damage due to the static electricity rarely occurs. The second gate short line 119b is preferably substantially parallel with the first gate short line 119a (FIGS. 6 and 7c).

A passivation layer 137 is formed by depositing an inorganic insulating material, such as $SiN_x$ and $SiO_x$, or by coating an organic insulating material, such as BCB and acrylic resin, on the substrate including the source elements (the source bus line 123, the source electrode 121, the drain electrode 131, the source pad 125, the second source short line 129 and the second gate short line 119b). A source contact hole 161 and a drain contact hole 171 are formed by removing a portion of the passivation layer 137, which covers the source pad 125 and the drain electrode 131, using a fourth mask. A gate short contact hole 181 is formed by removing a portion of the passivation layer 137 which covers connecting portions of the even-numbered gate pads 115 connected with the second gate short line 119b. A gate contact hole 151 and a short line cutting hole 193 are formed by removing the passivation layer 137 and the gate insulating layer 117, which cover the gate pad 115 and detoured connecting portions of the first gate short line 119a connected with the even-numbered gate pads. At this step, a source short contact hole 191 is formed by removing the passivation layer 137 and the gate insulating layer 117, which cover a portion of the first short line 129a connected with the odd source pads 125. A portion of the gate elements, which is exposed through the short line cutting hole 193, should preferably be removed. In other words, the odd-numbered gate pads which are connected with the first gate short line 119a, and the even-numbered gate pads which are connected with the second gate short line 119b, are disconnected by cutting the connecting portions of even-numbered gate pads 115 connected with the first gate short line 119a.

Figure 7D:
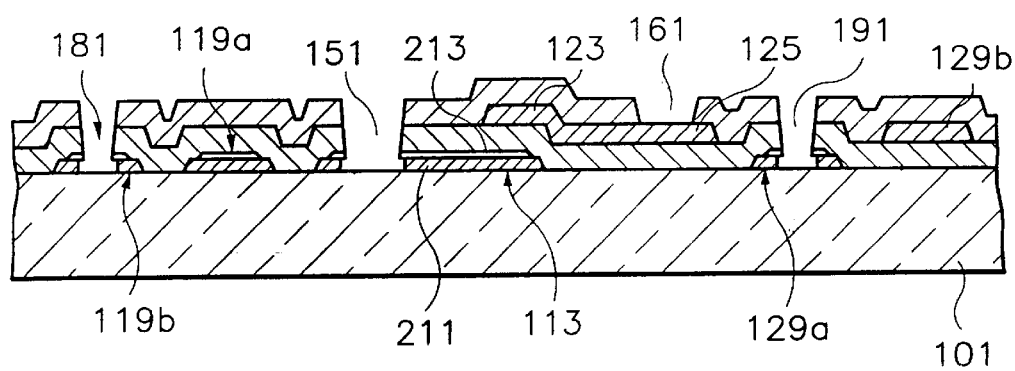

The connecting portions described above are preferably cut by using the same method that is used in the first preferred embodiment. The second metal layer 213 is removed at the time of dry-etching the passivation layer 137 and the gate insulating layer: 117. The aluminum, which still remains, is removed by using the same method that is used in the first preferred embodiment. After removing the photo-resist which used for etching the passivation layer 137 and the gate insulating layer 117, the chemical agent, which is used for removing the photo-resist, is eliminated by applying a strong air stream. A weak alkali which reacts well with the first metal layer 211 and rarely reacts with the passivation layer 137, is coated on the substrate. Thereby, a portion of the first metal layer 211, which is exposed through the short line cutting hole 193, is removed. When the connecting portions of the even-numbered gate pads 115 which are connected with the first gate short line 119a are cut, the gate pad 115, which is exposed through the contact holes, and the first source short line 129a, which is exposed through the source short contact hole 191, are also etched (FIG. 7d).

Figure 7E:
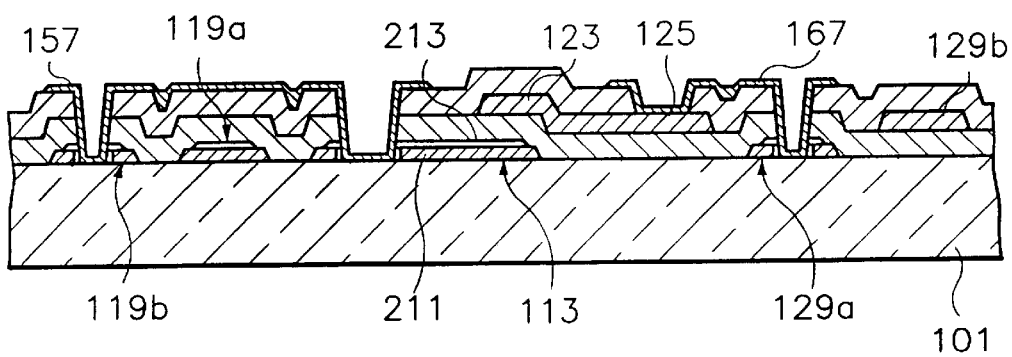

A transparent conductive material, such as ITO (Indium-Tin-Oxide), is deposited on the passivation layer 137. A pixel. electrode 141, a gate pad terminal 157 and a source pad terminal. 167 are formed by patterning the ITO using a fifth mask. The pixel. electrode 141 is connected with the drain electrode 131 which is exposed through the drain contact hole 171. The gate pad terminal 157 is connected with the etched side of the gate pad 115 which is etched along the contour of the gate contact hole 151. The gate pad terminal 157 is connected with the etched side of the second. metal layer 213 or with the etched side of the first metal layer 211 of the gate pad 115. Some gate pad terminals 157, which are connected with the even gate pads 115, are connected with the second gate short lines 119b, which are exposed through the gate short contact holes 181. The source pad terminal 167 is connected with the source pad 125 which is exposed through the source contact hole 161. Some source pad terminals 167, which are connected with the odd-numbered source pads 125, are connected with the profiles of the etched first source short lines 129a through the source short contact hole 191. Accordingly, the odd-numbered gate paces 115 are connected with the first gate short lines 119a, and the odd source pads 125 are connected with the first source short lines 129a. The even-numbered gate pads 115 are connected with the second gate short lines 119b, and the even-numbered source pads 125 are connected with the second source short lines 129b (FIGS. 6 and 7e).

Figure 8A:
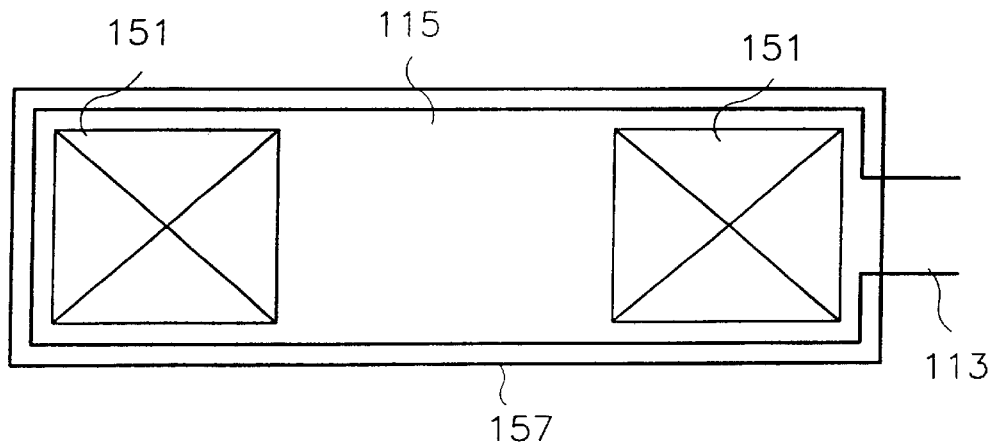
FIGS. 8a–8c are an views showing a various features of gate contact holes which are formed on the gate pad of the active panel according to preferred embodiments of the present invention.
Figure 8B:
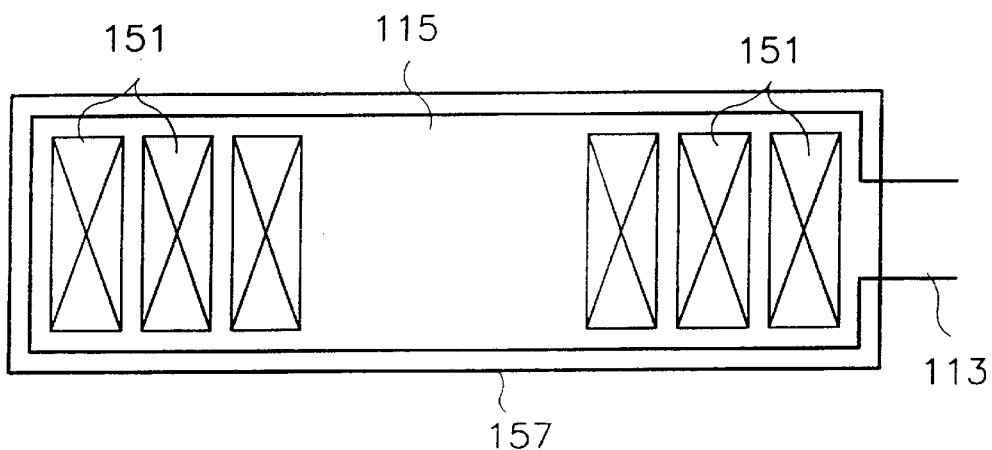
Figure 8C:
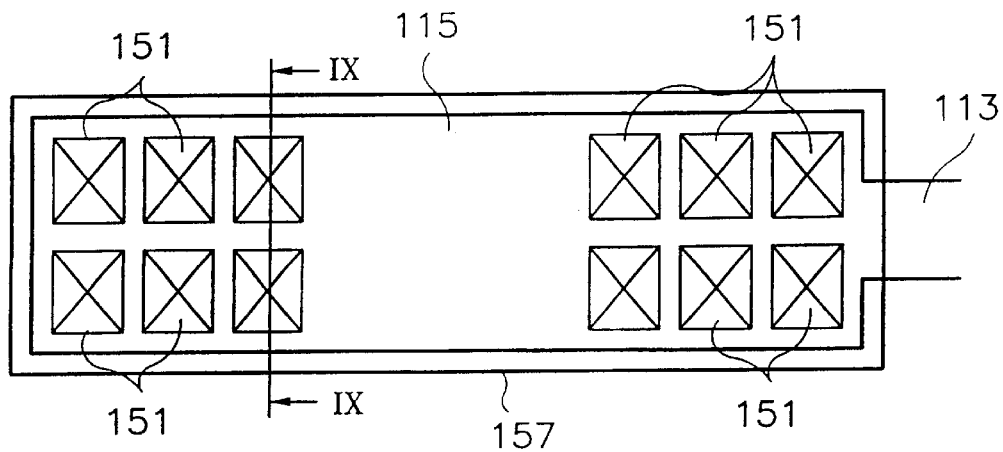

As described in the above preferred first and second embodiments, the gate pad terminal 157 is connected with the etched side of the second metal layer 213, which is aligned with the gate contact hole 151. The contact resistance between the gate pad terminal 157 and the gate pad 115 is proportional to the length of edge of the contact hole. In order to prevent the resistance of the gate pad from increasing, it is preferable to make the length of the edge of the contact hole 151 longer. Therefore, one gate contact hole 151 is preferably formed to have a plurality of small holes. The middle of the gate pad 115 will be connected with an external connecting terminal in order to receive an external electric signal. In order to achieve good contact with the external terminal, it is preferable that the contact hole is not formed on the middle portion of the gate pad. Various designs of the gate contact hole 151, which has a plurality of small holes on the gate pad 115 and satisfies the above described conditions, are shown in FIGS. 8a–8c.

Consequently, all portions of the gate elements, which are connected with the ITO, i.e. the gate pad, connecting portions of the odd-numbered source pads connected with the source pad short line, and an Ag dot which connects a common electrode of the gate signal with a common electrode on the color filter panel, preferably have the same structure with the above described structure of the gate pad.

In the LCD of preferred embodiments of the present invention, connection portions between the gate elements and the ITO will new be described in detail. The description mainly shows the gate pad with reference to FIGS. 9a–9c which are cross-sectional views taken along line IX—IX of FIG. 8c.

Figure 9A:
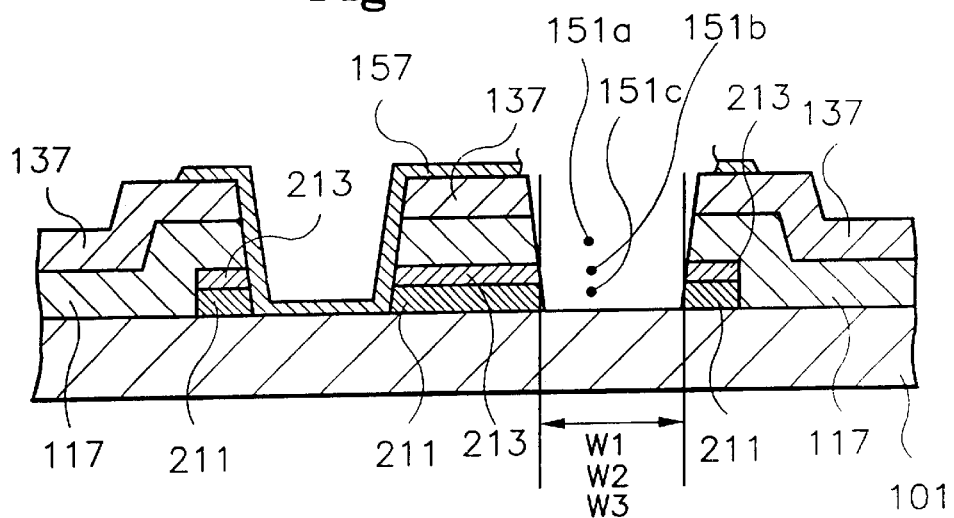
FIGS. 9a–9c are enlarged cross-sectional views showing various features of gate pads and gate contact holes of the active panel according to preferred embodiments of the present invention.

Because the second metal layer 213 is also etched at the time of forming a gate contact hole 151 by etching the passivation layer 137 and the gate insulating layer 117, the width ($W_1$) of an insulating layer contact hole 151a, which is formed in the gate insulating layer 117, is almost the same as the width ($W_2$) of a second metal contact hole 151b, which is formed in the second metal layer 213. Because the first metal layer 211 is also patterned along the second metal contact hole 151b, the width ($W_3$) of the first metal contact hole 151c is almost the same as the width ($W_2$) of the second metal contact hole 151b. Accordingly, the gate pad terminal 157 is connected with the etched side of the second metal layer 213 and the etched side of the first metal layer 211 (FIG. 9a).

Figure 9B:
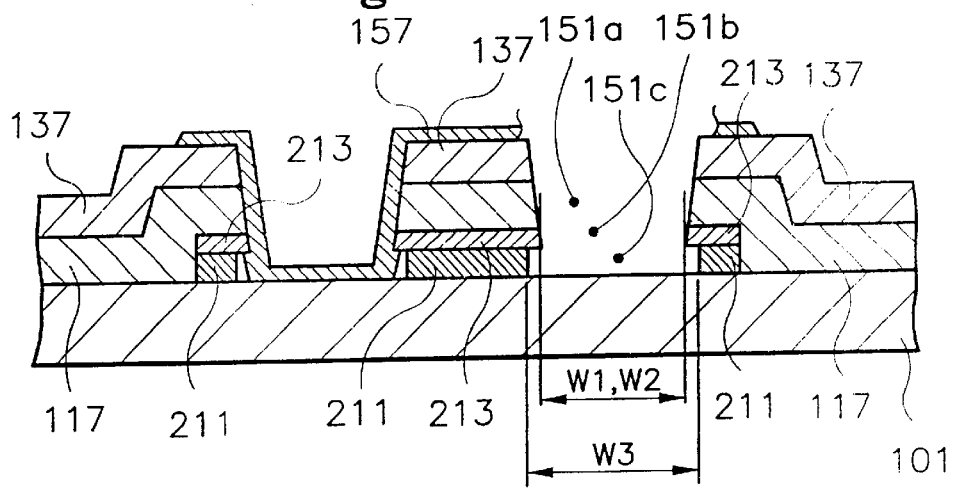
Figure 9C:
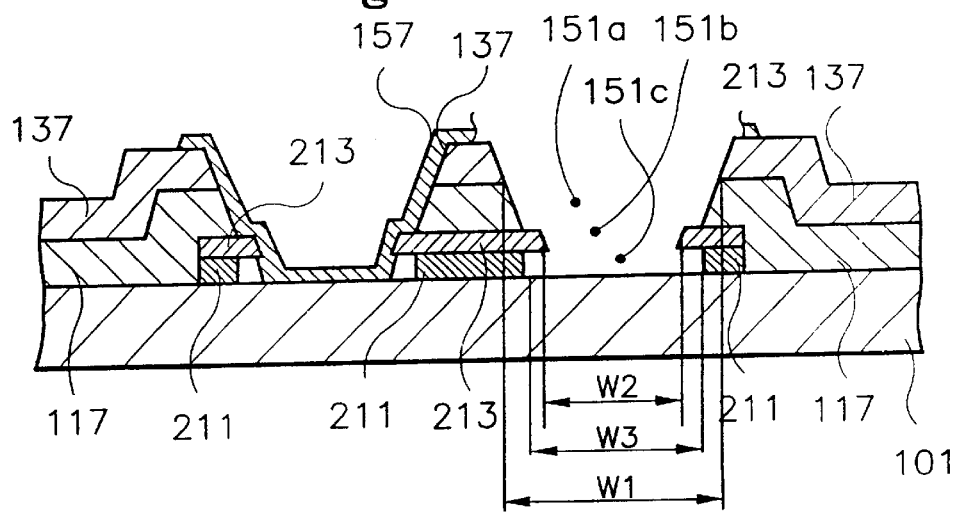

Generally, it takes considerable time to move the substrate to the rinsing room after forming the contact holes, and for removing the photo-resist and coating a chemical agent which rarely reacts with the passivation layer 137 and reacts well with the first metal layer 211. Accordingly, the first metal layer 211 is etched more under the second metal layer as shown in FIG. 9b, which is called "undercutting". As a result, the width ($W_3$) of the first metal contact hole 153c is larger than the width ($W_2$) of the second metal contact hole 153b. In this case, the gate pad terminal 157 is connected with the etched side of the second metal layer 213. Although the gate pad terminal 157 is not connected with the first metal layer 211, a connecting condition between the gate pad 115 and the gate pad terminal 157 is not affected. Because the first metal layer 211 is formed with aluminum and the gate pad terminal 157 is formed with ITO, an aluminum oxide film is formed at the interface between the aluminum and the ITO, resulting in an increase in the contact resistance. Therefore, the connecting condition is rarely affected whether the ITO is connected with the aluminum. Instead, it is important to prevent the contact resistance between the gate pad 157 and the second metal layer 213 from being increased. In order to achieve this, the insulating layer contact hole 151a is inclined by controlling the plasma energy, which is used at the time of forming the insulating layer contact hole 151a and the second metal contact hole 151b, so that the width ($W_1$) of the insulating layer contact hole 151a is preferably larger than the width ($W_2$) of the second metal contact hole 151b. As a result, the second metal layer 213 is more widely exposed and therefore, connecting portion thereof with the gate pad terminal 157 is increased, resulting in the prevention of the increase of the contact resistance.

As described above, the preferred embodiments of the present invention provides an LCD which includes gate elements formed of a metal having a low resistance and a method of manufacturing the same, in which the number of masking processes is reduced. Gate elements are formed by sequentially depositing aluminum and at least one of molybdenum, tantalum, tungsten and antimony, and patterning the gate elements using a single mask. Cutting the short line is performed at the steps of patterning the passivation layer and rinsing the resultant surface of the substrate. Therefore, the LCD of preferred embodiments of the present invention is manufactured by using only 5 masking processes, resulting in the increasing of the manufacturing yield and in the reduction of manufacturing costs and time.

While the invention has been particularly shown and described with reference to preferred embodiments thereof, it will be understood by those skilled in the art that the forgoing and other changes in form and details may be made therein without departing from the spirit of the invention.

What is claimed is:

1. A liquid crystal display comprising:
   a substrate; and
   a pad including:
      a first metal layer on the substrate;
      a second metal layer on the first metal layer;
      an insulating layer on the second metal layer;
      a first contact hole in the insulating layer;
      a second contact hole in the second metal layer and substantially aligned with the first contact hole;
      a third contact hole in the first metal layer and substantially aligned with the second contact hole; and
      a conductive layer connected to an etched side of the second metal layer via the first, second and third contact holes, the conductive layer contacting the substrate.

2. A liquid crystal display according to claim 1, wherein the first contact hole is larger than the second contact hole so that the conductive layer is connected with an exposed surface of the second metal.

3. A liquid crystal display according to claim 1, wherein the second contact hole is smaller than the third contact hole.

4. A liquid crystal display according to claim 1, wherein the contact hole is defined by a plurality of holes.

5. A liquid crystal display according to claim 4, wherein the contact holes are located at both ends of the pad and the contact holes are not located at a middle portion of the pad.

6. A liquid crystal display according to claim 1, wherein the first metal includes aluminum.

7. A liquid crystal display according to claim 1, wherein the second metal includes at least one of molybdenum, tantalum, tungsten and antimony.

8. The liquid crystal display as claimed in claim 1, wherein the conductive layer is formed from an indium tin oxide.

9. The liquid crystal display as claimed in claim 1, wherein the conductive layer is out of contact with the substrate.

10. The liquid crystal display as claimed in claim 1, wherein the insulating layer includes a gate insulating layer and a passivation layer.

11. The liquid crystal display as claimed in claim 1, wherein the first metal layer is larger than the second metal layer in width.

12. The liquid crystal display as claimed in claim 1, wherein the first metal layer is entirely covered by the second metal layer.

13. A liquid crystal display comprising:

a substrate; and a pad including:

a first gate pad electrode on the substrate;

a second gate pad electrode on the first gate pad electrode;

an insulating layer on the second gate pad electrode;

a first contact hole in the insulating layer;

a second contact hole in the second gate pad electrode and substantially aligned with the first contact hole;

a third contact hole in the first gate pad electrode and substantially aligned with the second contact hole; and a conductive layer connected to an etched side of the second gate pad electrode via the first, second and third contact holes, the conductive layer contacting the substrate.

* * * * *